United States Patent
Li et al.

(10) Patent No.: US 11,638,116 B2
(45) Date of Patent: Apr. 25, 2023

(54) ADJUSTING DFT COEFFICIENTS TO COMPENSATE FOR FREQUENCY OFFSET DURING A SOUNDING SEQUENCE USED FOR FRACTIONAL TIME DETERMINATION

(71) Applicant: Silicon Laboratories Inc., Austin, TX (US)

(72) Inventors: Wentao Li, Austin, TX (US); Yan Zhou, Spicewood, TX (US); Michael A. Wu, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 50 days.

(21) Appl. No.: 17/108,908

(22) Filed: Dec. 1, 2020

(65) Prior Publication Data
US 2022/0174453 A1  Jun. 2, 2022

(51) Int. Cl.
| | |
|---|---|
| *H04W 4/02* | (2018.01) |
| *G01R 23/175* | (2006.01) |
| *H04L 43/0852* | (2022.01) |
| *G01S 11/02* | (2010.01) |

(52) U.S. Cl.
CPC .......... *H04W 4/023* (2013.01); *G01R 23/175* (2013.01); *G01S 11/02* (2013.01); *H04L 43/0852* (2013.01)

(58) Field of Classification Search
CPC .................................................... H04W 4/023
USPC ...................................................... 455/456.1
See application file for complete search history.

(56) References Cited

U.S. PATENT DOCUMENTS

| | | |
|---|---|---|
| 7,676,210 B2 | 3/2010 | Paulus |
| 8,295,404 B1 | 10/2012 | Husted |
| 8,437,415 B2 | 5/2013 | Mudulodu et al. |
| 8,531,216 B1 | 9/2013 | Wu et al. |
| 8,615,213 B2 | 12/2013 | de Ruijter et al. |
| 8,644,426 B1 | 2/2014 | Zhou |
| 9,020,073 B2 | 4/2015 | van Waasen et al. |
| 9,720,875 B2 | 8/2017 | de Ruijter et al. |

(Continued)

OTHER PUBLICATIONS

Bluetooth SIG, Inc., "Supplement to the Bluetooth Core Specification," Bluetooth® Specification, Revision v9, Dec. 31, 2019, 37 pages.

(Continued)

*Primary Examiner* — Thomas J Lett
(74) *Attorney, Agent, or Firm* — Zagorin Cave LLP

(57) ABSTRACT

A receiver includes a first discrete Fourier transform (DFT) block to perform a first single tone DFT on a positive tone associated with a sounding sequence. A second DFT block performs a second single tone DFT on a negative tone associated with the sounding sequence. A DFT coefficient generation block generates first DFT coefficients based on a nominal frequency of the positive tone and an estimated frequency offset between a transmitter frequency and a receiver frequency. The DFT coefficient generation block generates second DFT coefficients based on a nominal frequency of the negative tone and the estimated frequency offset. Multipliers in the DFT blocks multiply I and Q values of the sounding sequence with the coefficients. Accumulators in the DFT blocks accumulate multiplier outputs. An arctan function receives averaged accumulated values from the first and second DFT blocks and supplies first and second phase values used to calculate fractional timing.

20 Claims, 8 Drawing Sheets

(56) References Cited

U.S. PATENT DOCUMENTS

| | | |
|---|---|---|
| 10,061,740 B2 | 8/2018 | de Ruijter et al. |
| 10,172,105 B2 | 1/2019 | de Ruijter et al. |
| 10,827,451 B2 | 11/2020 | Mudulodu |
| 2002/0097820 A1 | 7/2002 | Simmons |
| 2004/0120412 A1 | 6/2004 | Banerjea |
| 2004/0203470 A1 | 10/2004 | Berliner et al. |
| 2005/0190098 A1 | 9/2005 | Bridgelall et al. |
| 2007/0110096 A1* | 5/2007 | Geile ............ H04L 1/004 370/461 |
| 2007/0155341 A1 | 7/2007 | Haiut |
| 2009/0122319 A1 | 5/2009 | Ronnekleiv et al. |
| 2010/0020909 A1 | 1/2010 | Jung et al. |
| 2010/0109903 A1 | 5/2010 | Carrick |
| 2011/0129048 A1 | 6/2011 | Barbe et al. |
| 2012/0288040 A1 | 11/2012 | Yi |
| 2013/0080817 A1 | 3/2013 | Mihelic |
| 2013/0241774 A1 | 9/2013 | Shin et al. |
| 2013/0259049 A1 | 10/2013 | Mizrahi |
| 2013/0272322 A1 | 10/2013 | Sagarwala et al. |
| 2014/0254723 A1 | 9/2014 | Nazarathy et al. |
| 2015/0110231 A1 | 4/2015 | Alexander et al. |
| 2015/0280841 A1 | 10/2015 | Gudovskiy et al. |
| 2015/0346332 A1 | 12/2015 | Taylor, Jr. |
| 2016/0308633 A1 | 10/2016 | Liu et al. |
| 2019/0081834 A1 | 3/2019 | de Ruijter et al. |
| 2019/0306821 A1 | 10/2019 | Hu et al. |
| 2019/0332137 A1 | 10/2019 | Benjamini et al. |
| 2020/0166631 A1 | 5/2020 | Tong |
| 2020/0292665 A1* | 9/2020 | Behrens ............ G01S 13/325 |
| 2021/0058181 A1 | 2/2021 | Dwivedi et al. |
| 2021/0075557 A1 | 3/2021 | Mudulodu et al. |

OTHER PUBLICATIONS

Huang, B., et al., "A Robust Indoor Positioning Method Based on Bluetooth Low Energy with Separate Channel Information," Sensors, vol. 19, Issue 16, Aug. 9, 2019, 19 pages.

Zand, P., et al. "A High-Accuracy Phase-Based Ranging Solution with Bluetooth Low Energy (BLE)," 2019 IEEE Wireless Communications and Networking Conference (WCNC), Apr. 15-18, 2019, Marrkesh, Morocco, 9 pages.

Bluetooth SIG, Inc., "High Accuracy Distance Measurement," Bluetooth® Final Improvement Proposal Document (FIPD), Revision r07, Nov. 11, 2020, 98 pages.

Bluetooth SIG, Inc., "High-Accuracy Distance Measurement," Bluetooth® Draft Improvement Proposal Document (DIPD), Revision r11, Dec. 16, 2019, 79 pages.

* cited by examiner

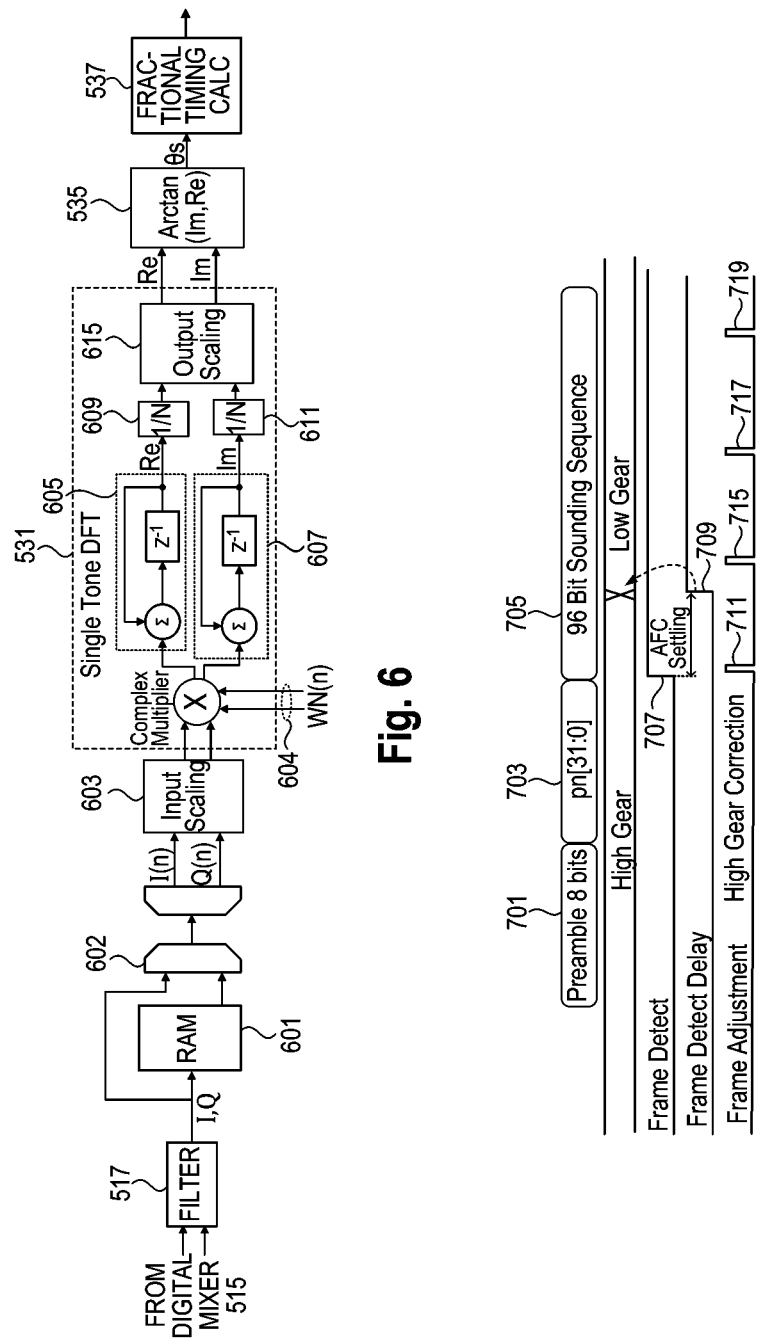

ADJUSTING DFT COEFFICIENTS TO COMPENSATE FOR FREQUENCY OFFSET DURING A SOUNDING SEQUENCE USED FOR FRACTIONAL TIME DETERMINATION

CROSS-REFERENCE TO RELATED APPLICATION(S)

This application is related to application Ser. No. 17/108,912, filed Dec. 1, 2020, now U.S. Pat. No. 11,502,883, entitled "ADJUSTING RECEIVER FREQUENCY TO COMPENSATE FOR FREQUENCY OFFSET DURING A SOUNDING SEQUENCE USED FOR FRACTIONAL TIME DETERMINATION USING," naming Wentao Li, Yan Zhou, and Michael Wu as inventors, which application is being filed on the same date as the present application and which application is incorporated herein by reference.

BACKGROUND

Field of the Invention

This disclosure relates to communications systems and more particularly to radio frequency (RF) apparatus and associated methods for distance measurements between wireless nodes.

Description of the Related Art

Distance between wireless nodes can be determined using phase measurements or time-based distance measurements through exchange of packets in short range radio frequency communications systems (e.g., systems compliant with Bluetooth™, Bluetooth™ Low Energy (BLE), Zigbee™, or other network protocol standards). Accurate distance measurements are useful in short range wireless technologies to improve device capability for localization, enhance security, and otherwise provide for a wider variety of short range wireless Internet of Things (IoT) applications. The local oscillators used in wireless nodes are independent of each other and distance measurements can be affected by the frequency offset of the oscillators in the wireless nodes. Accordingly, improved techniques for distance measurements that account for frequency offset are desirable.

SUMMARY OF EMBODIMENTS OF THE INVENTION

Accordingly, in one embodiment an apparatus includes a first discrete Fourier transform (DFT) block. The first DFT block includes a first complex multiplier coupled to receive imaginary components of a received signal, real components of the received signal, and first complex DFT coefficients. A first accumulator is coupled to the real outputs of the first complex multiplier and supplies first accumulated real values. A second accumulator receives imaginary outputs of the first complex multiplier and supplies first accumulated imaginary values. A DFT coefficient generation function generates the first complex DFT coefficients based in part on one or more estimated frequency offsets between a transmitter frequency and a receiver frequency and supplies the first DFT coefficients to the first complex multiplier.

In an embodiment the arctan function receives an average of the first accumulated real values and an average of the first accumulated imaginary values and supplies a first phase value.

In an embodiment a second DFT block includes a second complex multiplier coupled to receive the imaginary components of the received signal, the real components of the received signal, and second complex DFT coefficients. A third accumulator is coupled to real outputs of the second complex multiplier and supplies second accumulated real values. A fourth accumulator receives imaginary outputs of the second complex multiplier and supplies second accumulated imaginary values. The DFT coefficient generation function generates the second complex DFT coefficients based in part on the one or more estimated frequency offsets. The arctan function receives an average of the second accumulated real values and an average of the second accumulated imaginary values and supplies a second phase value.

In another embodiment, a method for determining fractional timing includes receiving a sounding sequence of alternating ones and zeros at a receiving device from a transmitting device. First coefficients used by a first complex multiplier of a first discrete Fourier transform (DFT) block are based in part on a frequency offset estimate of a frequency offset between a first frequency associated with the transmitting device and a second frequency associated with the receiving device. The DFT block supplies a first DFT output. Second coefficients used by a second complex multiplier of a second DFT block are based in part on the frequency offset estimate. The second DFT block supplies a second DFT output. A first phase based on the first DFT output and a second phase based on the second DFT output are determined. The phases are used in determining fractional timing.

In another embodiment an apparatus includes a first discrete Fourier transform (DFT) block that performs a first single tone DFT on a positive tone associated with a sounding sequence. A second DFT block performs a second single tone DFT on a negative tone associated with the sounding sequence. A DFT coefficient generation circuit generates first DFT coefficients that are based on a nominal frequency of the positive tone and one or more frequency offset estimates between a transmitter frequency and a receiver frequency and supplies the first DFT coefficients to the first DFT block. The DFT coefficient generation circuit also generates second DFT coefficients that are based on a nominal frequency of the negative tone and the frequency offset estimates and supplies the second DFT coefficients to the second DFT block.

BRIEF DESCRIPTION OF THE DRAWINGS

The present invention may be better understood, and its numerous objects, features, and advantages made apparent to those skilled in the art by referencing the accompanying drawings.

FIG. 6 illustrates additional details of an embodiment of a discrete Fourier transform (DFT) block.

FIG. 7 illustrates a timing diagram associated with transmission of the sounding sequence.

The use of the same reference symbols in different drawings indicates similar or identical items.

DETAILED DESCRIPTION

Figure 1:
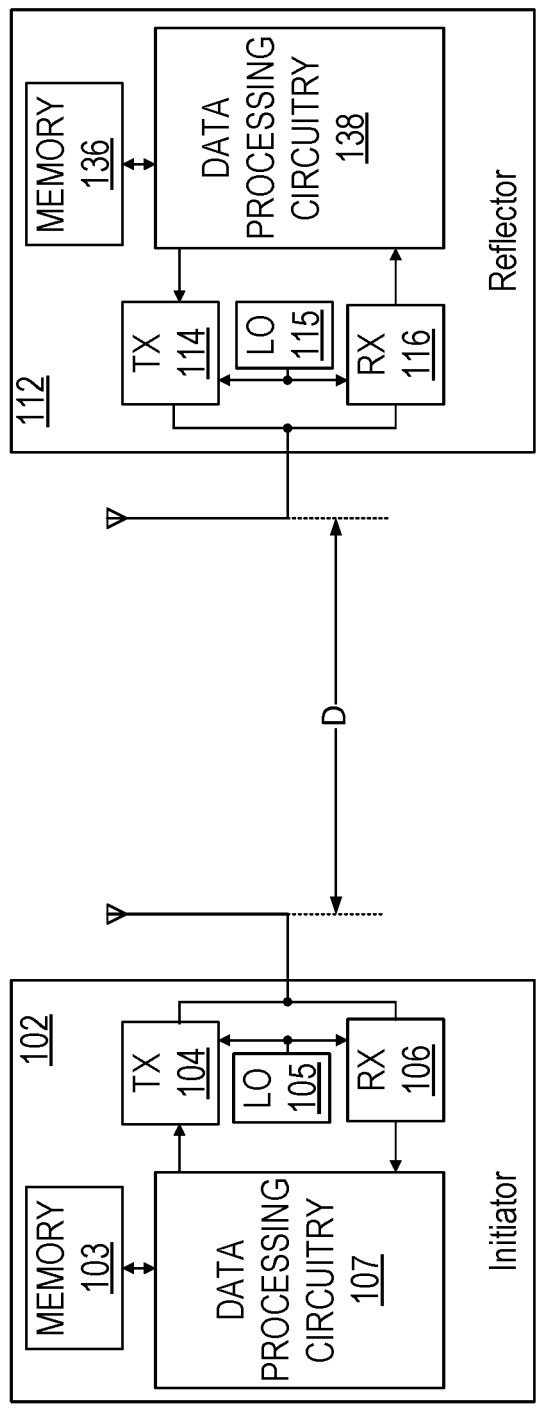
FIG. 1 illustrates a wireless communications system that includes a first communications with a transmitter and receiver communicatively coupled with a second communication device with a transmitter and receiver.

Referring to FIG. 1 an embodiment of a wireless communications system 100 includes communications device 102, which includes transmitter 104 and receiver 106, and communications device 112, which includes transmitter 114 and receiver 116. A distance D separates communications device 102 from communications device 112. Although communications device 102 and communications device 112 are illustrated as including only one antenna each, in other embodiments, communications device 102 and communications device 112 each include multiple antennas. In an embodiment, wireless communications system 100 is compliant with the BLE communications protocol designed for low power and low latency applications. However, in other embodiments, wireless communications system 100 is compliant with other communications protocols (e.g., Bluetooth Classic, Zigbee, or other short-range radio frequency protocol standards). Local oscillator 105 and local oscillator 115 provide signals used in transceiver functions of communications device 102 and communications device 112, respectively. Data processing circuitry 107 and 138 are respectively coupled to memory 103 and 136. The operation of the data processing circuitry will be described further herein. Note that the transmitter and receiver in each communications device shares the data processing circuitry.

Figure 2:
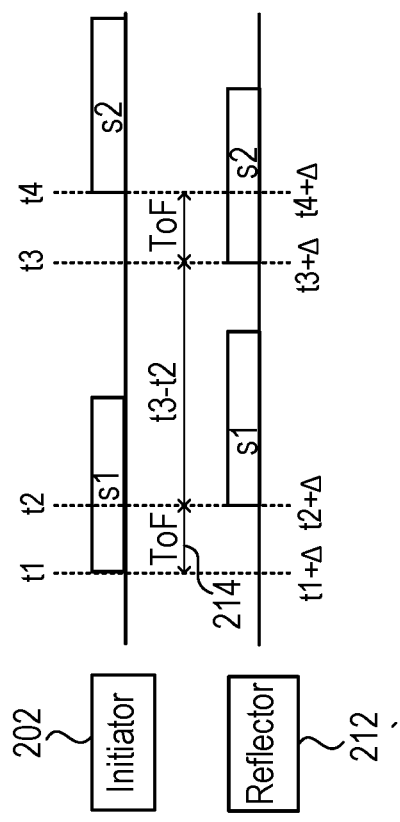
FIG. 2 illustrates one form of distance measurement referred to as round trip time (RTT) that involves exchanging packets between two communication devices.

FIG. 2 illustrates one form of distance measurement referred to as round trip time (RTT) that involves exchanging packets between an initiator device 202, such as communications device 102 in FIG. 1, and a reflector device 212, such as reflector device 112 in FIG. 1. A time offset $\Delta$ seconds exists between initiator 202 and the reflector 212. At time t1 at the initiator, the reflector time is t1+$\Delta$. At time t1, the initiator sends a packet (symbol s1) to the reflector. The symbol S1 arrives at the reflector at reflector time t2+$\Delta$. The time it takes to travel from initiator device 202 to the reflector device 212 is referred to as the time of flight (ToF). The forward ToF 214=t2+$\Delta$−t1. At time t3+$\Delta$ the reflector 212 sends symbol s2 to the initiator 202, which receives s2 at time t4. The reverse TOF=t4−(t3+$\Delta$). The round trip ToF=(t2−t1)+(t4−t3). The clock offset $\Delta$ cancels for the round trip time calculation. By exchanging symbols or packets that include the local time that symbols or packets were sent and received, a coarse round trip time can be determined. The one way time of flight, and therefore the distance, can be determined by dividing the round trip time by 2. The distance D shown in FIG. 1 is determined by (the one way ToF)×c where c is the speed of light.

Figure 3:
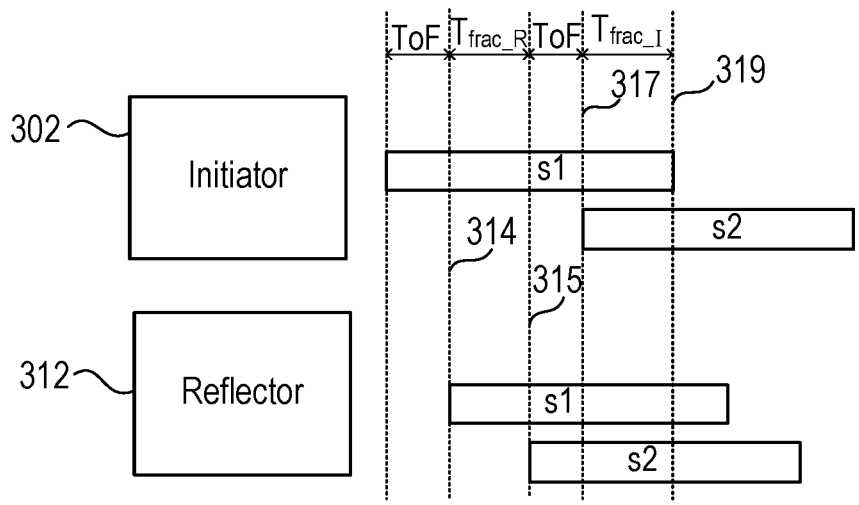
FIG. 3 illustrates the time error that can be determined and corrected using fractional timing.

In an embodiment, the target resolution for a distance measurement is 0.5 m. That is, the goal is to determine a distance that is accurate to within 0.5 m. Since radio waves travel at the speed of light c ($3\times10^8$ m/s), that means the ToF target resolution is (0.5 m/c), or 1.6 ns. The resolution depends on the sampling frequency and even if the sampling frequency is high, the difference between the active edge of the sampling clock and the beginning of the start of the incoming symbol provides further error in the round trip measurement. FIG. 3 illustrates that error. Initiator device 302 transmits symbol s1 to reflector 312. Symbol s1 arrives at reflector 312 after a time period that is the ToF. Fractional time for the reflector $T_{FRAC\_R}$ reflects the difference from the start of the incoming symbol (s1) at 314 at the reflector to the local sampling instant 315 of the reflector device 312. Fractional component $T_{FRAC\_I}$ for the initiator indicates the difference from the start of receipt of the incoming symbol (s2) at 317 in the initiator to the local sampling instant 319 for the initiator device 302. The coarse time is combined with fractional time to determine the total ToF and make the distance measurement more accurate. In particular:

$$ToF = \frac{1}{2}(T_{coarse\_initiator} - T_{coarse\_reflector} + (T_{FRAC\_I} + T_{FRAC\_R}))$$

Note that the fractional times add to the difference of the coarse times.

Figure 4:
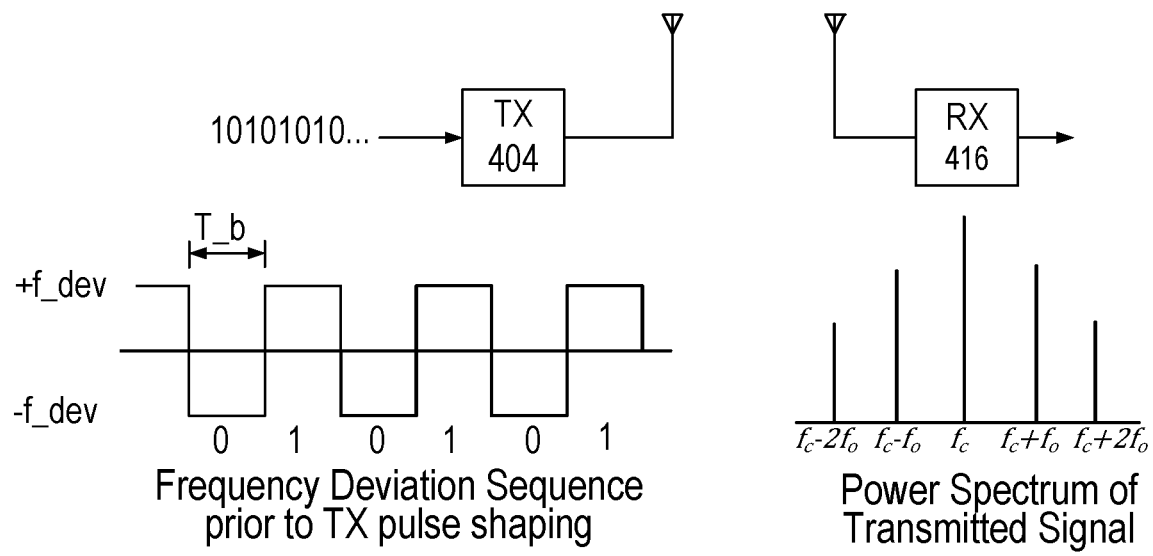
FIG. 4 illustrates a sounding sequence of alternating ones and zeros being supplied to a receiver that results in a tonal output utilized to determine fractional timing.

One way to perform fractional RTT measurements is to use a sounding sequence. FIG. 4 illustrates a sounding sequence of alternating ones and zeros being supplied to transmitter 404 and the power spectrum of the TX signals after being modulated with Frequency Shift Keying (FSK). That results in a tonal output that includes tones at fc−fo and fc+fo. When operating BLE at 1 Mbps the tones fc+fo and fc−fo are at +500 kHz and −500 kHz, respectively, at baseband in the receiver 416. The frequency fo is half of the symbol rate, due to the periodicity of alternating between 1 and 0 at the symbol rate. When operating BLE at 2 Mbps, the tones are at ±1 MHz at baseband in the receiver. Fractional RTT time and therefore improved RTT resolution can be obtained be measuring the phase difference of the two tones at the receiver.

Figure 5:
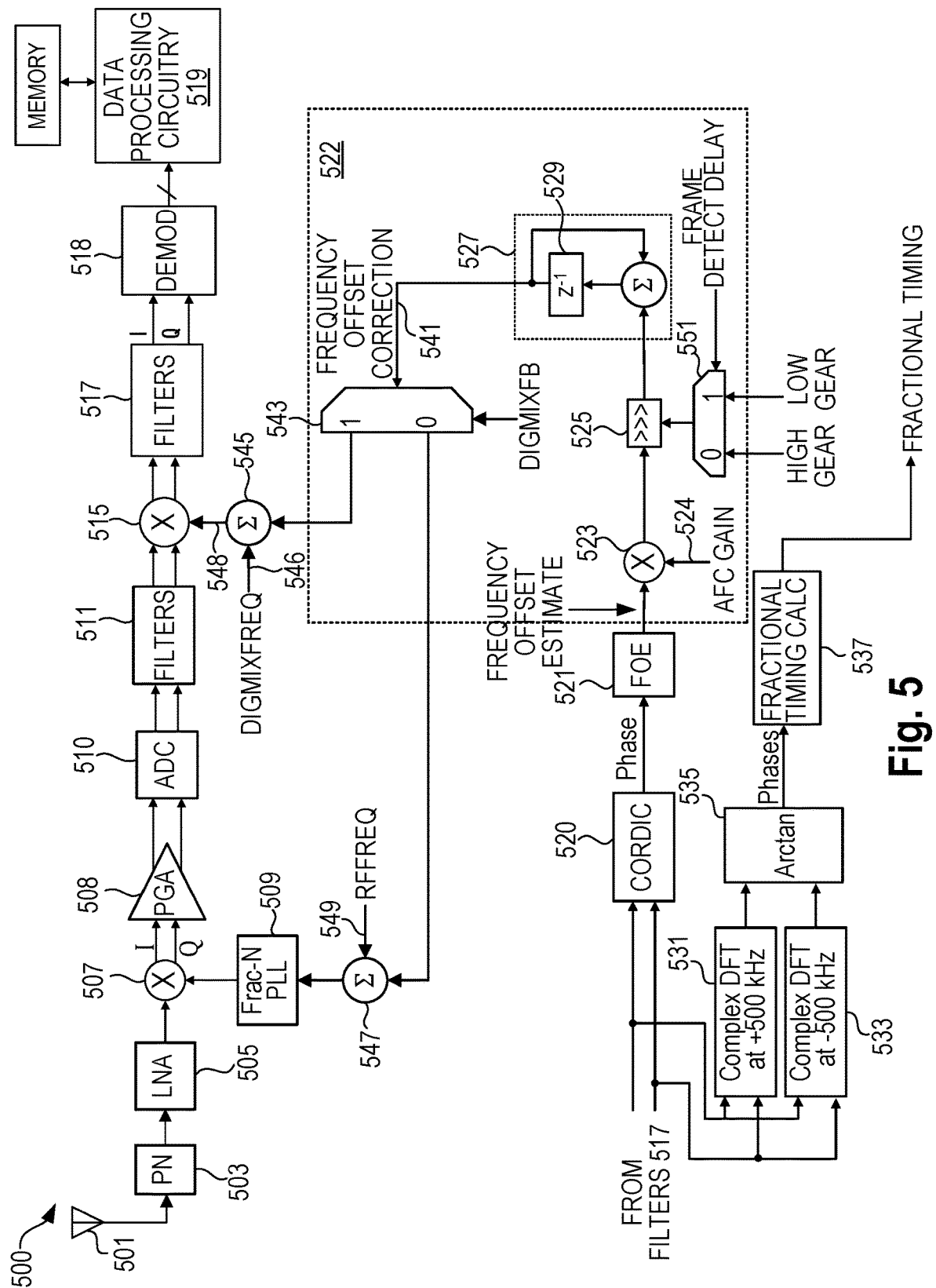
FIG. 5 illustrates a receiver according to an embodiment.

FIG. 5 illustrates a block diagram of an embodiment of a receiver 500 included in wireless communications device 112 or wireless communications device 102 that provides a fractional timing measure using the two tones fc+fo and fc-fo from the sounding sequence. The receiver improves the fractional timing measure by accounting for frequency offset between the transmitter and receiver. Antenna 501 provides an RF signal to passive network (PN) 503 that provides impedance matching, filtering and electrostatic discharge protection. Low-noise amplifier (LNA) 505 amplifies the signals from passive network 503 without substantial degradation to the signal-to-noise ratio and provides the amplified RF signals to mixer 507. Mixer 507 performs frequency translation or shifting of the RF signals, using a local oscillator (LO) signal provided by a frequency synthesizer block 509. In an embodiment, the frequency synthesizer is implemented using a fractional-N phase-locked loop (PLL). In one operational mode, receiver 500 is configured as a low-intermediate frequency (LIF receiver) and translates the RF signal to a low intermediate frequency (e.g., 100-200 kHz) to avoid DC offset and 1/f noise problems of zero-IF receivers.

Mixer 507 provides the translated output signal as a set of two signals, an in-phase (I) signal, and a quadrature (Q) signal to programmable gain amplifiers (PGA) 508. The I and Q signals are analog time-domain signals. In at least one embodiment of receiver 500, the analog amplifiers 508 and filters (not separately illustrated) provide amplified and filtered version of the I and Q signals to analog-to-digital converter (ADC) 510, which converts those versions of the I and Q signals to digital I and Q signals. Exemplary embodiments of ADC 510 use a variety of signal conversion techniques (e.g., delta-sigma (or sigma-delta) analog to digital conversion). In an embodiment, the ADC block 510 also includes a decimator. ADC 510 provides digital I and Q signals to digital filters 511, which provides digital filtering of the digital I and Q signals and provides the filtered I and Q signals to the digital mixer 515. Digital mixer 515 frequency translates the IF signal to baseband and supplies the baseband signal to the filters 517. In an embodiment filters 517 includes a decimator, channel filter, and sample rate converter that are not separately illustrated. Filter 517 provides the filtered baseband signals to the demodulator 518. The demodulator 518 performs demodulation of the digital I and Q signals to retrieve or extract information, such as data signals, that were modulated (e.g., in a transmitter (not shown)), and provided to antenna 501 as RF signals. The demodulator 518 provides the demodulated data to the data processing circuitry 519, which corresponds to data processing circuitry 107 and 138 in FIG. 1. In embodiments data processing circuitry 519 performs a variety of functions (e.g., logic, arithmetic, etc.). For example, data processing circuitry 519 uses the demodulated data in a program, routine, or algorithm (whether in software, firmware, hardware, or a combination) to perform desired control or data processing tasks. In an embodiment, the data processing circuitry includes a processor such as a microcontroller and software and/or firmware to perform the desired functions. Note that the functionality of FIG. 5 described so far in the path between the antenna 501 and the data processing circuitry 519 is well known in the art.

The embodiment of the receiver shown in FIG. 5 further includes circuitry that provides more accurate RTT measurements. In an embodiment, the goal of the RTT measurement approach is to reach 0.5 m resolution, which requires roundtrip time of flight measurements with a uncertainty of 1.6 nsec. One way to achieve that resolution is to use a coarse RTT measurement and then an optional fine RTT measurement. The optional fine RTT measurement takes a single point DFT at the positive frequency and a single point DFT at the negative frequency and compares the phases of the two DFT calculations to make the fractional time measurements. Thus, the sounding sequence (101010 . . . ) may be used to provide a fractional time estimate that is combined with the coarse RTT measurement to obtain a more accurate RTT measurement.

The fractional time measurement performs single bin DFTs with one DFT centered at the +500 kHz tone and another DFT centered on the −500 kHz tone (or centered on the ±1 MHz tones) embedded in the sounding sequence. The fractional time measurement determines a phase difference between the two tones and uses the phase difference to determine the fractional timing as described further herein. The use of the fractional time measurement improves the resolution of the RTT and therefore makes the distance measurement more accurate.

Frequency offset represents a frequency difference between a clock signal used in the transmitting device and a clock signal used in the receiving device. The clock signals may be based on the local oscillators or other clock generation logic used in the respective devices. While fractional time measurements improve accuracy, frequency offset between the transmitter and receiver during the sounding sequence results in errors in the fractional RTT measurement based on the +/−500 KHz tones or the ±1 MHz tones. The error can be very large if the frequency offset approaches 15 KHz. Even with less frequency offset, simulations have shown that the RTT error doubles (from 3 ns to 6 ns delay per measurement) with a 5 kHz frequency offset. Accordingly, embodiments herein compensate for the frequency offset to provide a more accurate fractional timing value for use in RTT measurements.

Referring still to FIG. 5, the digital filters 517 following the digital mixer 515 supply complex discrete Fourier transform (DFT) blocks 531 and 533. DFT blocks 531 performs a single bin DFT at +500 kHz and DFT block 533 performs a single bin DFT centered at −500 kHz to obtain complex numbers. The complex signal information from each of the two DFT blocks are supplied to the arctangent function 535. The arctangent function 535 determines a phase based on the complex number provided for the positive tone and for the negative tone. Those phases are then used by the fractional timing calculation block to provide a fractional timing value that can be combined with coarse the RTT measurement. The +500 KHz and −500 KHz tones resulting from sending the 101010 sounding sequence follow the phase and time relationships shown below:

$$\theta_{500k} = 2\pi f_{500K} t$$

$$\theta_{-500k} = -2\pi f_{500K} t$$

$$\Delta\theta = \theta_{500k} - \theta_{-500k} = 4\pi f_{500k} t_{frac}, \text{ and thus,}$$

$$t_{frac} = \frac{\theta_{500k} - \theta_{-500k}}{4\pi \times 500 \times 10^3} \left( \text{or } t_{frac} = \frac{\theta_{1M} - \theta_{-1M}}{4\pi \times 1 \times 10^6} \text{ for 2 MHz } BLE \right)$$

The DFTs are performed on the filter outputs to obtain the signal information at the two tones. FIG. 6 illustrates additional details of an embodiment of DFT block 531. The digital filters 517 supplies a memory 601 which in turn supplies I and Q values to the DFT block 531 through input scaling block 603. Multiplexer circuit 602 allows the memory 601 to be bypassed to send the output of digital filters 517 directly to the DFT input scaling block 603. DFT block 533 is identical and also receives scaled I and Q values from the memory 601 through input scaling block 603. The DFT input scaling block 603 scales the incoming I,Q signals to avoid saturation for large signals and reduce the effects of quantization for small signals. The complex multiplier receives the twiddle factors WN(n) 604 and supplies complex multiplication results to the accumulators 605 and 607, one for the real component of the DFT and the other accumulator for the imaginary component. The two complex WN(n) inputs to the multiplier provide the real and imaginary components of WN(n). DFT block 533 receives WN(n) values corresponding to the other frequency of interest, e.g., −500 kHz or −1 MHz. In an embodiment the DFT blocks 531 and 533 are each formed of dedicated DFT circuitry. In other embodiments, programmed processor logic may be used to perform some or all of the multiplications and additions, or any appropriate combination of programmed processor and dedicated logic may be used.

The twiddle factors are based in part on center frequency of the bin, e.g., 500 kHz, the over sampling ratio (OSR) and the length of the sounding sequence, The oversampling ratio (OSR) refers to the ratio of the sample rate of the system to the symbol rate of the PHY. For example, the OSR may be 4 to 7 or some other appropriate number depending on the frequency of the signal being sampled and the frequency of the sampling clock. In an embodiment the DFT block 533 accumulates values from 64 symbols of the sounding sequence (M=64) for the signal tone DFT calculation and the total samples N=OSR*M. For BLE 1 MHz, the ±500 kHz tones are located at DFT bins k=M/2. For BLE 2M, the ±1000 kHz tones are also located at DFT bins k=M/2. The twiddle factors supplied to the complex multiplier correspond to the +500 kHz tone for one of the DFTs and to the −500 kHz tone for the other DFT. For the +500 kHz tone:

$$WN(n) = e^{\frac{j2\pi \times 500 \times 10^3 n}{fs}} = e^{j2\pi kn/N} = e^{j2\pi n/(2 \times OSR)},$$

where fs is the sampling frequency.
For the −500 kHz tone:

$$WN(n) = e^{\frac{-j2\pi \times 500 \times 10^3 n}{fs}} = e^{-j2\pi kn/N} = e^{-j2\pi n/(2 \times OSR)}$$

In an embodiment the twiddle factors are calculated in data processing circuitry 519 (see FIG. 5), another processing unit, or precalculated and stored in non-volatile memory (NVM) for use by the complex multiplier. The accumulators 605 and 607 for the real component and imaginary components of the multiplication result accumulate the results from the samples of the 64 symbols of the sounding sequence. Averaging blocks 609 and 611 average the accumulated values and supply their average to the DFT output scaling block 615. The DFT output scaling block 615 scales the accumulator output to maximize resolution for small signals and avoid saturation for large signals that exceed the bit width of circuits downstream. The DFT output scaling block 615 provides its output to arctan function 535. The arctan function 535 generates phase values ($\theta_{500\_k}$ and $\theta_{-500\_k}$) based on the accumulated real and imaginary components of the DFT outputs. Fractional timing calculation block 537 calculates the fractional timing $t_{frac}$, as described above, based on the difference in the two phases. In an embodiment, that calculation is implemented in software or firmware running on data processing circuitry 519 or another processor in the receiver.

Thus, the two tones found at baseband can be used to determine the fractional timing. However, a frequency offset between the initiator and reflector leads to inaccuracies in the fractional timing estimation. Embodiments described herein compensate for the frequency offset during the sounding sequence so the fractional timing estimate is more accurate. The embodiment utilizes frequency offset estimates and adjusts the digital mixer 515 or the mixer 507 based on the estimated timing offsets to increase the accuracy of the fractional timing estimate.

FIG. 7 shows a timing diagram illustrating the transmission of the sounding sequence from the initiator (transmitting device) to the reflector (receiving device) or vice versa. The transmission includes a preamble 701, a 32 bit sync word 703, e.g., PN sequence pn[31:0] and a 96 bit sounding sequence 705. In an embodiment the preamble is an 8 bit sequence of alternating 1s and 0s. The PN sequence is a 32 bit pseudo noise sequence also referred to as a pseudo random binary sequence (PRBS) that is known to both the initiator and reflector. In an embodiment, the end of the sync word marks the beginning of the sounding sequence. The receiver 500 in FIG. 5 detects the receipt of the PN sequence (or other sync word), e.g., using demodulator 518 (or other circuitry) and asserts a frame detect signal indicating detection of the reception of the PN sequence at 707, which also marks the beginning of the sounding sequence. The frequency offset estimator 521 generates a frequency offset estimate based on the preamble, the PN sequence, or both.

Referring back to FIG. 5, Coordinate Rotation Digital Computer (CORDIC) 520 receives the I and Q values from filters 517. In general, a CORDIC implements known techniques to perform calculations, including trigonometric functions and complex multiplies, without using a multiplier. The operations the CORDIC uses are addition, subtraction, bit-shift, and table-lookup operations. In other embodiments, a digital signal processor executing firmware is used. In at least one embodiment, CORDIC 520 receives filtered versions of I and Q from digital filters 517 and converts digital I and Q signals from a Cartesian representation into polar representation by performing an arctangent operation. The polar representation includes a phase and magnitude. The phase is supplied to the frequency offset estimator (FOE) 521, which provides an estimate of the frequency offset between the clock signals associated with the initiator (e.g., the local oscillator) and clock signals associated with the reflector (e.g., the local oscillator).

In at least one embodiment, the frequency offset estimator (FOE) 521 receives phase values from CORDIC 520 and supplies frequency offset estimates to frequency offset correction circuit 522. Frequency offset estimator 521 generates a frequency offset estimate $f_{EST}$ (i.e., $f_{EST}=f_{reflector}-f_{initiator}$) based on the phase values. For example, frequency offset estimator 521 differentiates the phase output of the CORDIC by computing discrete time phase difference values (e.g., $\phi[n]-\phi[n-1]=f_x$). Frequency offset estimator 521 subtracts a value corresponding to an expected phase difference value, which is predetermined and stored in memory, from the incoming discrete time phase difference values, accumulates the error, and divides by a predetermined number of symbols (e.g., 8≤N≤32 symbols) to form an estimate of the frequency error. The expected phase difference values are based upon an expected frequency of the transmitted signal. For example, in BLE the expected frequency is based on the specified frequency deviation $f_{DEV}$ for the physical layer (e.g., ±250 kHz), which determines the frequency of the transmitted signal.

For example, for frequency shift keying, when transmitting a '1,' the transmitter transmits a radio frequency tone having frequency $f_{RF}+f_{DEV}$, and when transmitting a '0,' the transmitter transmits a tone having frequency $f_{RF}-f_{DEV}$. In an exemplary embodiment that uses the eight symbols of the preamble to estimate the frequency error, expected values $\xi_1, \xi_2, \xi_3, -\xi_1, -\xi_2, -\xi_3$, which correspond to the expected instantaneous frequency deviation (i.e., the phase difference over a symbol), are stored in memory. Values of $\xi_1, \xi_2,$ and $\xi_3$, vary with the system BT parameter (e.g., bandwidth×bit time=0.5), which determines the effects of transmitter pulse shaping and receiver filtering bandwidth. In at least one embodiment, effects of filtering in the receiver and transmitter pulse shaping from one bit can affect subsequent bits, which is known as Inter Symbol Interference (ISI). If sequential symbols include a relatively long run of '1's, the full frequency deviation is expected (e.g., $\xi_1$). If sequential symbols alternate between '1' and '0', the expected frequency deviates less than the full frequency deviation due to effects of the filtering (e.g., ±$\xi_3$). Each expected value corresponds to a different data pattern of three bits (i.e., $b_n$, $b_{n-1}$, and $b_{n-2}$). Exemplary values of $\xi_1$, $\xi_2$, and $\xi_3$ correspond to expected deviations $f_{DEV}$ of 250 kHz, 173 kHz, and 92 kHz, respectively, after receiver filtering. The expected deviations will vary according to characteristics of filtering implemented in the receiver. If sequential symbols include a relatively long run of '1's, the full frequency deviation (e.g., 250 kHz) is expected and assuming an exemplary transmitter has an offset of 50 kHz, then the transmitted signal has a frequency of $f_{RF}+f_{DEV}+50$ kHz. Accordingly, frequency offset estimator 521 would compute the average frequency offset value as follows:

$$\frac{1}{N}\sum_{i=0}^{N-1}|f_x - f_{expected}| = \frac{1}{N}\sum_{i=0}^{N-1}|300 \text{ kHz} - 250 \text{ kHz}| = 50 \text{ kHz}$$

For a 32 bit PN sequence the sum of the actual ($f_X$) and expected ($f_{expected}$) values will of course be different.

Frequency offset estimator 521 provides the frequency offset estimates to the frequency offset correction circuit 522. The gain circuit 523 in the frequency offset correction circuit 522 receives the frequency offset estimates. The gain circuit 523 scales the frequency offset estimate according to the AFC GAIN value 524 and supplies the scaled value to the shift circuit 525. The AFC gain scales the frequency estimates to the resolution used by the digital mixer. The shift circuit scales the scaled version of frequency offset estimate according to a high gear or low gear setting. With a high gear setting, the scaled frequency offset is supplied without any adjustment to the accumulator 527. With a low gear setting, the scaled frequency offset from gain circuit 523 is reduced using a digital shift of, e.g., eight bits, equivalent to a divide by 256. Other shift values (more than two gears) may of course be used according to the needs of the particular implementation. Embodiments combine the AFC gain function with the gear shift. AGC gain is typically used for scaling gain, while gear shift is used select how much of the frequency estimate should be used for frequency offset compensation. The output of the shifter circuit 525 is supplied to the accumulator 527, which stores the accumulated value in a register 529 and periodically supplies the accumulated scaled value as a frequency offset correction signal 541 to a demultiplexer circuit 543. In an embodiment, the gear shifting can be bypassed by having the same scaling (or no scaling) occur for high gear and low gear. The demultiplexer circuit 543 supplies the frequency offset correction signal 541 to either to the summing circuit 545 or to the summing circuit 547, which serve as adjustment circuits to adjust the frequency utilized by the digital mixer 515 or the mixer 507 supplied by frequency synthesizer 509. The summing circuit 545 sums the nominal digital mixer frequency (digmixfreq) 546 with the frequency offset correction signal and supplies the adjusted frequency to the digital mixer 515 for conversion of the intermediate frequency signal to baseband. Alternatively, the demultiplexer circuit 543 supplies the frequency offset correction signal to the summing circuit 547, which combines the frequency offset correction signal with the reference frequency control signal 549, and supplies the combined control signal to control the frequency synthesizer 509, e.g., through a delta sigma modulator used to control the feedback divider of the fractional-N PLL implementing the local oscillator function. The adjusted frequency of the LO signal supplied by a frequency synthesizer block 509 is supplied as the LO signal used by mixer 507 to convert the RF signal to an intermediate frequency signal. Note that in at least one embodiment, both mixers are adjusted based on the frequency offset correction signal.

Referring again to FIG. 7 along with FIG. 5, once the frame detect signal is asserted at 707 the frame detect signal is delayed for a predetermined amount of time until 709 to allow for AFC settling. In an embodiment the delay is 8 symbol cycles. Frequency offset estimator 521 estimates the frequency error based on the received preamble and the sync word (or just the sync word). The high gear setting will be applied to generate the first frequency offset correction at 711 to adjust the mixers 507 or 515 at the beginning of the sounding sequence to compensate for the frequency offset. The AFC high gear adjustment attempts to completely correct the frequency offset. The high gear setting corrects for the frequency offset faster but can cause transients in the signal. Once the delayed frame detect asserts at 709, the multiplexer 551 selects the low gear control signal to supply a divided down frequency offset estimate to accumulator 527, which in turns supplies the frequency offset correction signals at 715, 717, and 719 to continue frequency adjustments during the sounding sequence. The frequency adjustments at 711, 715, 717, and 719 are maintained until the next frequency adjustment occurs. There is one output for the accumulator 527 for each input into frequency offset correction circuit 522. The purpose is to reference the frequency estimate back to the digmixfreq 546. Suppose the current frequency offset correction 541 is at −10 kHz and the transmitter frequency shifts, and the new frequency offset estimate is +20 kHz. The new frequency offset estimate is based on the adjusted digmixfreq 548 (digmixfreq 546 adjusted by the frequency offset correction 541) so the +20 kHz is relative to the adjusted digmixfreq 548 meaning the adjusted digmixfreq 548 should go up by +20 kHz. Thus, accumulator 527 sums the −10 kHz offset correction in register 529 and the new +20 kHz offset estimate to make the next frequency offset correction 541 increase the baseline digmixfreq 546 by +10 kHz to increase the adjusted digmixfreq 548 by 20 kHz. If instead of increasing, the transmitter frequency stays the same after the −10 kHz correction, the new frequency offset estimate would be 0 (assuming a perfect correction). After frame detect delayed asserts, the gear setting switches from high to low gear and the receiver 500 continues to gradually perform frequency correction during the sounding sequence. That improves the sounding sequence measurement performance in the presence of frequency offset. The lower gear setting corrects for the offset gradually and limits interference to the I and Q signals. The frequency adjustment operates to center the tones around DC in baseband so the DFTs performed at ±500 kHz provide data used for phase compensation that is as accurate as possible. For example, if the frequency offset causes the tones to be at +490 kHz and −510 kHz without offset compensation, the frequency adjustments recenter the tones which are, e.g., 1000 kHz apart, around DC (0 Hz) to provide greater DFT accuracy since the DFTs are configured for the nominal values of the plus and minus tones. Note that recentering the tones around DC may not be perfect due to normal limitations of circuits and their operation and thus some error may be left even after compensation.

Figure 8:
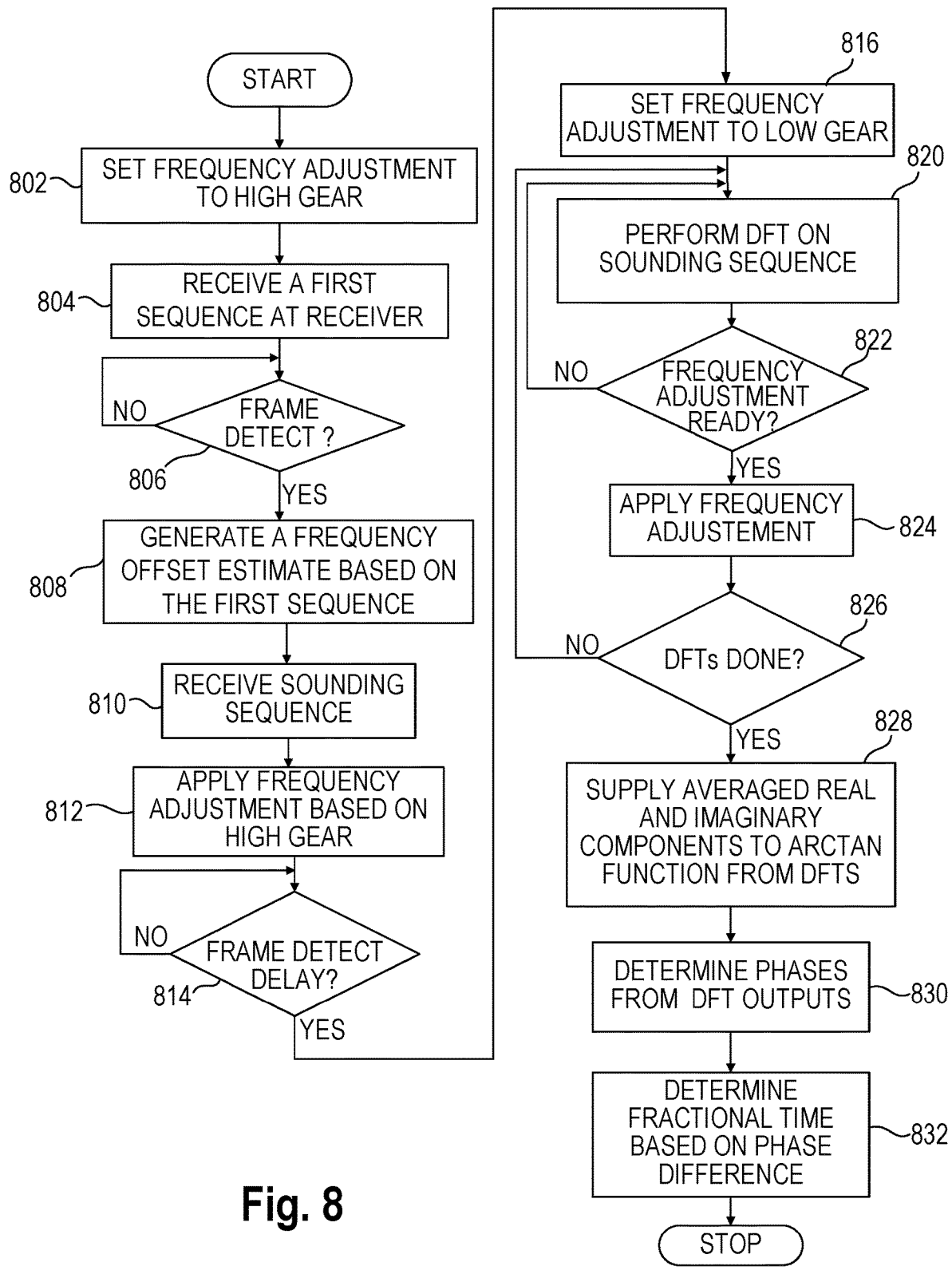
FIG. 8 illustrates a flow diagram of operation of an embodiment that compensates for frequency offset during a sounding sequence by adjusting the local oscillator or the digital mixer based on the estimated frequency error.

FIG. 8 illustrates a flow diagram of operation of an embodiment that compensates for frequency offset during a sounding sequence by adjusting the local oscillator or the digital mixer based on the estimated frequency error. The flow illustrates operation of control logic and other circuits in the receiver 500. The control logic may be implemented as digital logic, in firmware as part of a programmed microcontroller, or in any appropriate combination of digital, programmable logic, firmware, and/or higher level software. At 802 the frequency adjustment is set to high gear responsive to the frame detect signal being low. At 804 the receiving device receives a first sequence. In an embodiment, that sequence includes a preamble and a PN sequence. In 806 the receiver looks for the frame detect indicating that reception of the sync word is complete. The frequency offset estimator estimates a frequency offset based on the first sequence of the preamble and/or the PN sequence (or a portion thereof) in 808. In 810 the receiver starts receiving the sounding sequence formed of alternating ones and zeroes. In an embodiment, the sounding sequence is 96 symbols long. A frequency adjustment based on the high gear setting is made at the end of the sync word in 812 to compensate for and try to eliminate any frequency offset between the transmitting and receiving device. In 814 the flow waits for the frame detect delay to be asserted. Once the frame detect delay is asserted, the frequency adjustment is set to low gear in 816. In an embodiment, the DFTs are delayed until the frame detect delay is asserted. In an embodiment the DFTs are performed on 64 bits, which occurs in 820. While the DFTs are being performed, the frequency offset compensation continues. In 822, if a frequency adjustment is ready, the frequency adjustment is applied to the local oscillator provided by the fractional-N PLL or is applied to the digital frequency control signal for the digital mixer in 824. In 826 the control logic checks to see if the DFT calculation on the sounding sequence 820 is complete. When the sounding sequence is complete or the number of bits of the sounding sequence (M) required for the DFTs have been processed, the averaged real and imaginary components from the DFTs are supplied, after scaling, to the arctan function in 828, which determines the phases in 830. The fractional timing is determined based on the phase difference in 832. Assuming the fractional timing is determined first in the reflector, the reflector provides the fractional timing information to the transmitter so the transmitter can determine an RTT measurement as described above.

Thus, the embodiments shown in FIGS. 5-8 describe an approach to improving the fractional timing measurement of an RTT measurement by compensating for the frequency offset between transmitting and receiving device during fractional timing measurement during the sounding sequence by adjusting the local oscillator or the frequency used by the digital mixer based on the estimated frequency offset.

Figure 9:
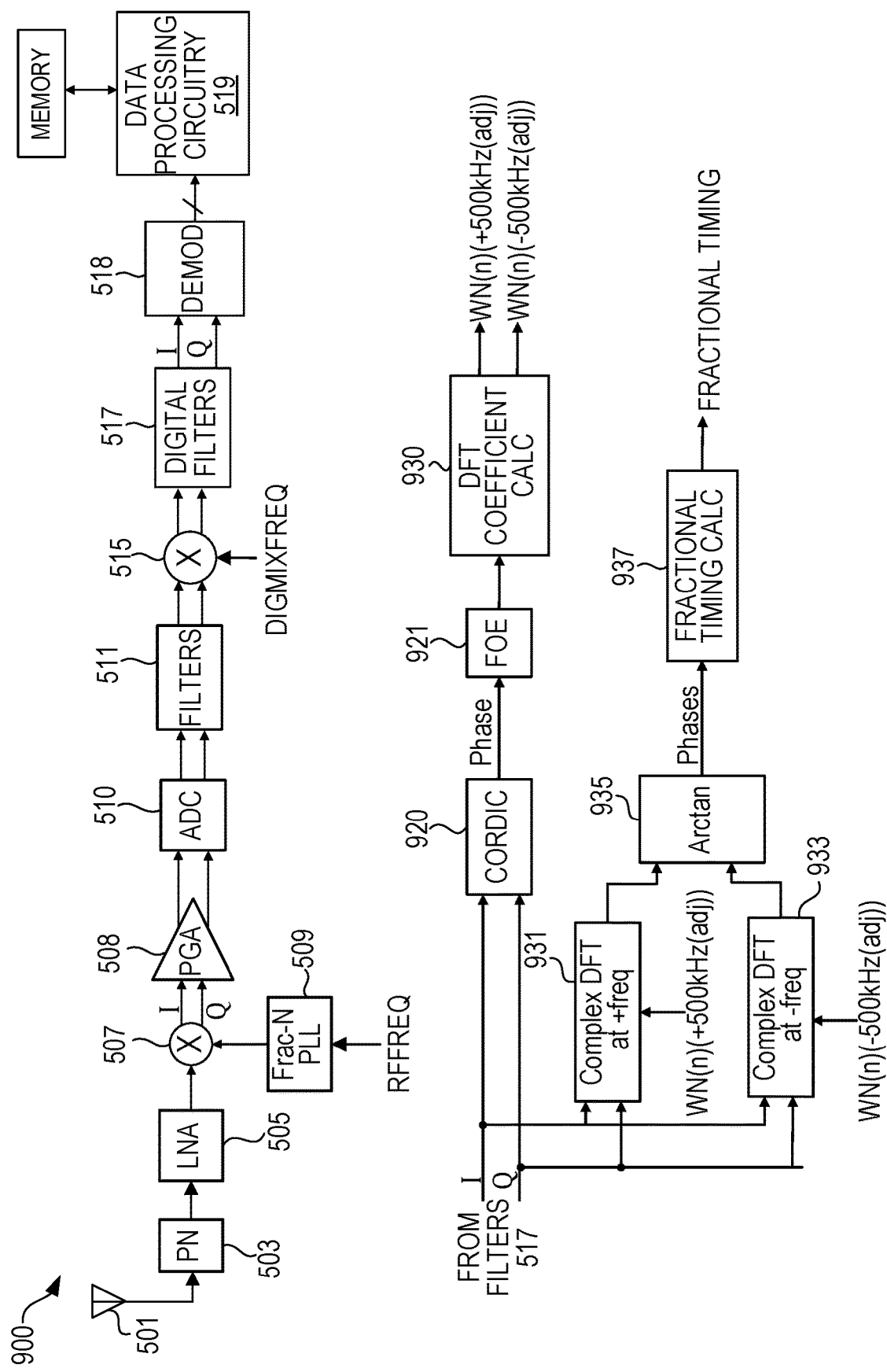
FIG. 9 illustrates an embodiment that compensates for the frequency offset between transmitting and receiving devices during a fractional timing measurement by adjusting DFT coefficients based on the estimated frequency offset.

FIG. 9 illustrates an embodiment of another approach to compensating for the frequency offset between transmitting and receiving devices during a fractional timing measurement. The receiver 900 includes a signal path from antenna 501 to data processing circuitry 519 that is the same as the path shown in FIG. 5. However, the frequency of the signal supplied by the frequency synthesizer block 509 to the mixer 507 and the frequency control signal (DIGMIXFREQ) controlling the frequency used by the digital mixer 515 are not adjusted based on a frequency offset estimate. Instead, the receiver 900 compensates for the estimated frequency offset by adjusting the DFT coefficients used by the two DFTs for the positive and negative tones, e.g., +/−500 kHz, based on the frequency offset.

Referring still to FIG. 9 the filtered I and Q digital values from filter 517 are supplied to CORDIC 920. Frequency offset estimator (FOE) 921 receives the phase value from the CORDIC 920 and generates a frequency offset estimate. The CORDIC 920 and the FOE 921 function as described earlier in the description of CORDIC 520 and FOE 521 in FIG. 5. Note that in embodiments the FOE outputs are accumulated, scaled, and/or averaged. In an embodiment the DFT calculation utilizes M=64 bits of the sounding sequence for signal tone DFT calculation (M=64). The total samples N=OSR*M. For BLE 1 MHz, the ±500 kHz tones are located at tone numbers k=M/2. For BLE 2 MHz, the ±1000 kHz tones are also located at tone numbers k=M/2.

The DFT coefficient calculation block 930 receives the frequency offset estimates and generates DFT coefficients that are adjusted from a nominal setting for the positive and negative frequencies, e.g., +/−500 kHz. In particular, the +500 kHz tone is adjusted by $\Phi(n)$:

$$WN(n) = e^{\left(\frac{j2\pi kn}{N}+\Phi(n)\right)} = e^{\left(\frac{j2\pi n}{2\times OSR}+\Phi(n)\right)} \text{ where } \Phi(n) = \frac{j2\pi n \times \Delta f}{2 \times OSR \times 500 \text{ kHz}},$$

where $\Phi(n)$ is estimated, from the PN[31:0] sequence and $\Delta f$ is the frequency offset estimate.
For the −500 kHz tone:

$$WN(n) = e^{\left(\frac{-j2\pi kn}{N}+\Phi(n)\right)} = e^{\left(\frac{-j2\pi n}{2\times OSR}+\Phi(n)\right)}$$

The DFT coefficient calculation block 930 functionality may be implemented in a programmed microcontroller unit (MCU) or other processor, dedicated logic, or in any appropriate combination of digital, programmable logic, firmware, and software. Separate logic in DFT coefficient calculation block 930 may be dedicated to calculation of coefficients for each DFT. While the twiddle factors are shown for the tones at +/−500 kHz, the twiddle factors are set according to the tones being detected. Thus, e.g., for 2 MHz BLE the nominal tones to be detected are at +/−1 MHz.

The DFT calculation block 930 supplies the adjusted twiddle factors WN(n) to the complex DFT blocks 931 and 933. The adjustment to the twiddle factors ensures the DFT bins are centered at the appropriate frequency given the estimated frequency offset. For example, if the frequency offset results in tones at +490 kHz and −510 kHz, the DFT coefficients are adjusted so the bins for single tone DFT blocks 931 and 933 are centered respectively at +490 kHz and −510 kHz. The arctan function block 935 receives the outputs of the DFT blocks and supplies phases used by fractional timing calculation block 937 to calculate the fractional timing as previously described.

Figure 10:
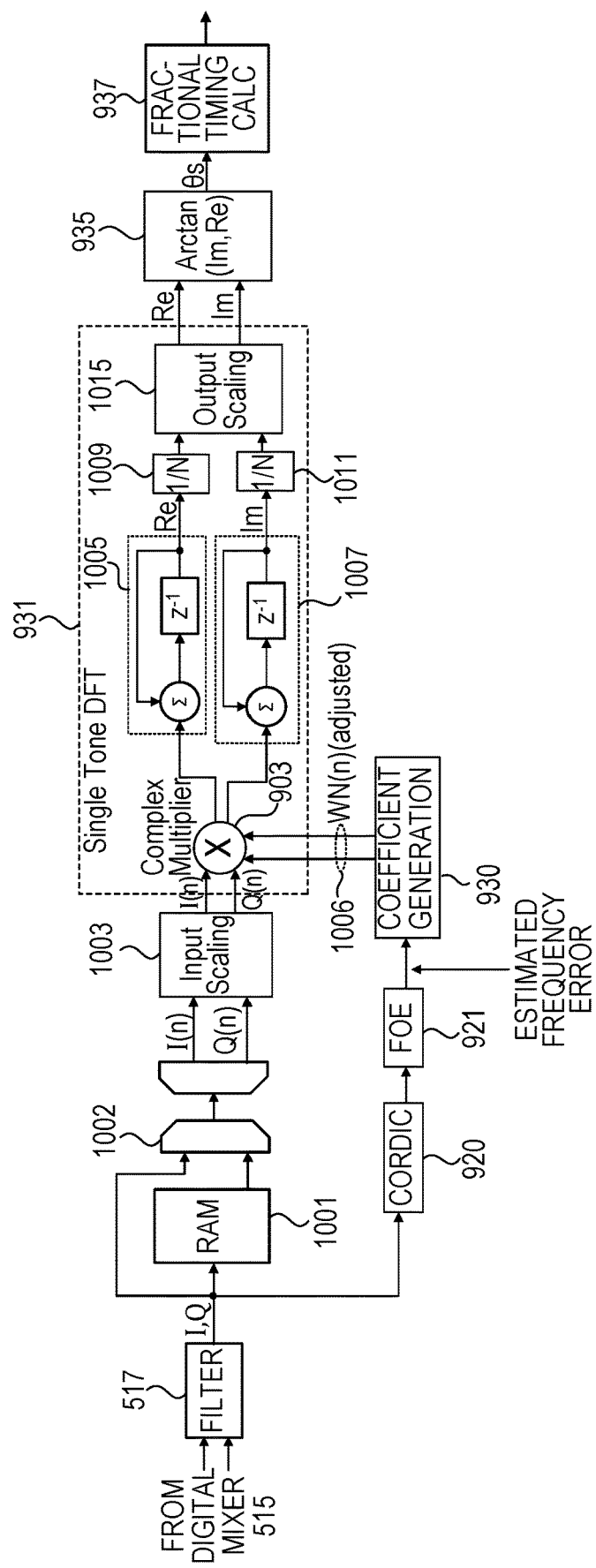
FIG. 10 illustrates additional details associated with the DFT blocks.

FIG. 10 illustrates additional details of an embodiment of DFT block 931 (or 933). Only one block is illustrated as the blocks are the same except they receive different twiddle factors. The digital filters 517 supplies a memory 1001 which in turn supplies I and Q values to the DFT block 931 (and DFT block 933) through input scaling block 1003. Multiplexer circuit 1002 allows the memory 1001 to be bypassed to send the output of digital filters 517 directly to the DFT input scaling block 1003. The DFT input scaling block 1003 scales the incoming I,Q signals to avoid saturation for large signals and reduce the effects of quantization for small signals. The complex multiplier 903 receives the adjusted complex twiddle factor WN(n) 1006 and the I(n) and Q(n) values of the samples of the 64 symbols of the sounding sequence from memory 1001 and supplies complex multiplication results that are accumulated in the two accumulators 1005 and 1007, one for the real component of the DFT and another for the imaginary component. Averaging blocks 1009 and 1011 average the accumulated values and supply their average to the DFT output scaling block 1015. The DFT output scaling block 1015 scales the accumulator output to maximize resolution for small signals and avoid saturation for large signals that exceed the bit width of circuits downstream. The DFT 931 (and 933) feed their results to the arctan function 935, which then generates phase values ($\theta_{500kadj}$ and $\theta_{-500kadj}$) for the adjusted frequencies based on the real and imaginary components of the accumulated DFT values. The fractional timing $t_{frac}$ is based on the difference in the two phases:

$$t_{frac} = \frac{\theta_{500kadj} - \theta_{-500kadj}}{4\pi \times 500 \times 10^3},$$

where the adjusted phases $\theta_{500kadj}$–$\theta_{-500kadj}$ represent the phases calculated using the adjusted twiddle factors. While nominal ±500 kHz tones have been described for a 1 MHz BLE embodiment, the tones depend on the frequencies used in the particular embodiment.

Figure 11:
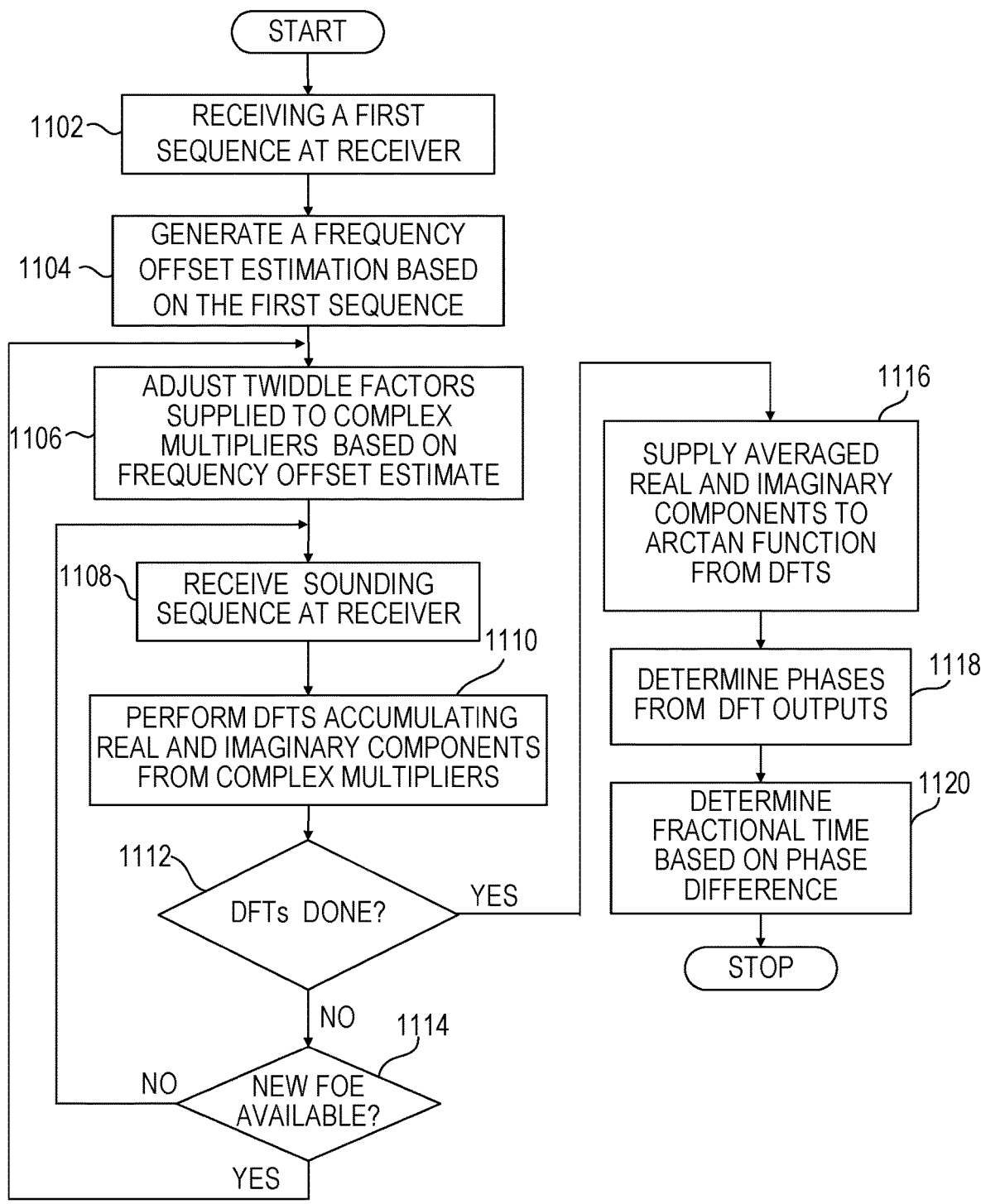
FIG. 11 illustrates a flow diagram of an operation in a receiver to compensate for the frequency offset during a fractional measurement made during a sounding sequence by adjusting DFT coefficients based on the estimated frequency offset.

Thus, the two tones at baseband during the sounding sequence can be used to determine the fractional timing based on the phases of the two tones. Compensation for the frequency offset between the transmitter and receiver results in a more accurate fractional timing result. FIG. 11 illustrates a flow diagram of an operation in a receiver to compensate for the estimated frequency offset during a 1, 0, 1, 0, . . . sounding sequence. The flow illustrates operation of control logic and other circuits. The control logic may be implemented as digital logic, in firmware as part of a programmed microcontroller, or in any appropriate combination of digital, programmable logic, and firmware, or software. At 1102 the receiving device receives a first sequence. In an embodiment, that sequence includes a preamble and a PN sequence. The frequency offset estimator estimates a frequency offset based on at least the PN[31:0] sequence in 1104. An MCU or other logic adjusts the twiddle factors for the two single tone DFTs in 1106 based on the estimated error offset. For example, the DFTs may be adjusted based on the frequency offset estimate to process tones at +490 kHz and –510 kHz rather than the nominal values of ±500 kHz. In 1108 the receiver receives a sounding sequence formed of alternating ones and zeroes. In an embodiment the sounding sequence is 96 symbols long but that length is exemplary and other sounding sequence lengths are used in different embodiments. The number of bits of the sounding sequence used for the DFTs, e.g., 64 bits or 96 bits, may also vary between embodiments. The DFT logic performs the single tone DFTs at the adjusted plus and minus frequencies that are adjusted based on the frequency offset estimate(s) and the accumulators accumulate the complex results from the multipliers. In 1112 the control logic checks if the DFTs have completed the required number of sounding sequence samples and if not checks to see if a new frequency offset estimate is available in 1114. The frequency offset estimate is periodically available during the sounding sequence. If no new frequency offset estimate is available, the flow returns to receiving the sounding sequence in 1108 and performing the DFTs in 1110. If a new frequency offset estimate is available the flow returns to 1106 to adjust the twiddle factors of the two DFTs to more accurately compensate for the current frequency offset estimate. In such an embodiment the frequency offset estimates continue during the sounding sequence resulting in $\Delta f$ in $\phi(n)$ changing during the sounding sequence. In at least one embodiment in which frequency offsets continue during the sounding sequence and $\Delta f$ changes during the sounding sequence, the frequency offset estimates are scaled, e.g., using high gear/low gear as described above to adjust $\Delta f$. In another embodiment, frequency adjustment is made based on at least a portion of the first sequence (e.g., the syncword) to eliminate any frequency offset between the transmitting and receiving device and no additional frequency offset determinations are made during the sounding sequence. In such an embodiment the frequency offset estimates do not continue during the sounding sequence resulting in $\Delta f$ in $\phi(n)$ being fixed during the sounding sequence based on one or more frequency offset estimates made based on the first sequence. In either case, the DFTs are performed on the positive and negative frequency tones until the sounding sequence is completed or the number of samples in the sounding sequence required for the DFTs has been processed. Once the DFTs are completed, the averaged (and scaled) real and imaginary components from the DFTs are supplied to the arctan function in 1116 which computes the phases in 1118. The fractional time is computed in 1120 based on the phase differences supplied. Assuming the fractional timing is determined first in the reflector, the reflector provides the fractional timing information to the transmitter so the transmitter can determine an RTT measurement as described above.

Thus, a receiver that compensates for frequency offset between a transmitter and receiver during a sounding sequence using an estimated frequency offset has been described. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:
1. A receiver comprising:
digital filters in a receive path of the receiver to provide imaginary components of a received signal and real components of the received signal;
a first discrete Fourier transform (DFT) block including,
a first complex multiplier coupled to receive the imaginary components of the received signal and the real components of the received signal and to receive first complex DFT coefficients;
a first accumulator to receive real outputs of the first complex multiplier and to supply first accumulated real values;
a second accumulator to receive imaginary outputs of the first complex multiplier and to supply first accumulated imaginary values; and
a DFT coefficient generation function to generate the first complex DFT coefficients based in part on one or more estimated frequency offsets between a transmitter frequency and a receiver frequency and to supply the first complex DFT coefficients to the first complex multiplier.
2. The receiver as recited in claim 1 further comprising:
an arctan function coupled to receive an average of the first accumulated real values and an average of the first accumulated imaginary values and supply a first phase value.
3. The receiver as recited in claim 2 further comprising:
a second DFT block including,
a second complex multiplier coupled to receive the imaginary components of the received signal and the real components of the received signal and second complex DFT coefficients; and
a third accumulator to receive real outputs of the second complex multiplier and to supply second accumulated real values;
a fourth accumulator to receive imaginary outputs of the second complex multiplier and to supply second accumulated imaginary values wherein the DFT coefficient generation function generates the second complex DFT coefficients based in part on the one or more estimated frequency offsets; and
wherein the arctan function is coupled to receive an average of the second accumulated real values and an average of the second accumulated imaginary values and supply a second phase value.

4. The receiver as recited in claim 3 wherein the received signal is a sounding sequence generated with an alternating ones and zeros pattern.

5. The receiver as recited in claim 4 wherein the one or more estimated frequency offsets are generated using, at least in part, a sequence received prior to the sounding sequence.

6. The receiver as recited in claim 4 further wherein the first DFT block performs a first single tone DFT for a positive tone associated with the sounding sequence and the second DFT block performs a second single tone DFT for a negative tone associated with the sounding sequence.

7. The receiver as recited in claim 6 wherein the positive tone is nominally 500 kHz or 1000 kHz and the negative tone is nominally −500 kHz or −1000 kHz.

8. The receiver as recited in claim 6 wherein the first DFT coefficients are generated by adjusting nominal first coefficients for a nominal frequency of the positive tone by $\Phi n$, where $\Phi(n) = e^{j2\pi\Delta fn/(2 \times OSR \times 500\ kHz)}$, where $\Delta f$ is the frequency offset estimate, and OSR is the over sampling ratio.

9. The receiver as recited in claim 8 wherein the second DFT coefficients are generated by adjusting nominal second coefficients for a nominal frequency of the negative tone by $\Phi n$, where $\Phi(n) = e^{j2\pi\Delta fn/(2 \times OSR \times 500\ kHz)}$.

10. The receiver as recited in claim 3 further comprising:
fractional timing logic to determine a fractional timing value based on a difference between the first phase value and the second phase value.

11. A method for determining fractional timing comprising:
receiving at a receiving device a sounding sequence of alternating ones and zeros transmitted from a transmitting device;
generating first coefficients used by a first complex multiplier of a first discrete Fourier transform (DFT) block, the first coefficients being based in part on a frequency offset estimate of a frequency offset between a first frequency associated with the transmitting device and a second frequency associated with the receiving device;
supplying a first DFT output from the first DFT block;
generating a second coefficients used by a second complex multiplier of a second DFT block based in part on the frequency offset estimate;
supplying a second DFT output from the second DFT block; and
determining a first phase based on the first DFT output and a second phase based on the second DFT output.

12. The method as recited in claim 11 further comprising:
accumulating a first real part and a first imaginary part supplied by the first complex multiplier to generate an accumulated first real part and an accumulated first imaginary part; and
supplying an average of the accumulated first real part and an average of the accumulated first imaginary part to an arctan function for use in generating the first phase.

13. The method as recited in claim 12 further comprising:
accumulating a second real part and a second imaginary part supplied by the second complex multiplier to generate an accumulated second real part and an accumulated second imaginary part; and
supplying an average of the accumulated second real part and an average of the accumulated second imaginary part to the arctan function for use in generating the second phase.

14. The method as recited in claim 11 further comprising:
determining fractional timing value based on a difference between the first phase and the second phase.

15. The method as recited in claim 11 wherein the first and second DFTs are single tone DFTs.

16. The method as recited in claim 11 further comprising generating the frequency offset estimate based, at least in part, on a sequence received preceding the sounding sequence.

17. The method as recited in claim 11 further comprising:
generating one or more additional frequency offsets estimates during the sounding sequence;
generating additional first coefficients for the first DFT block, based in part on the one or more additional frequency offset estimates; and
generating additional second coefficients for the second DFT block, based in part on the one or more additional frequency offset estimates.

18. The method as recited in claim 11,
wherein the first coefficients are based on a first nominal value of a positive frequency adjusted by the frequency offset estimate; and
wherein the second coefficients are based on a second nominal value of a negative frequency adjusted by the frequency offset estimate.

19. An apparatus comprising:
a first discrete Fourier transform (DFT) block to perform a first single tone DFT on a positive tone associated with a sounding sequence;
a second DFT block to perform a second single tone DFT on a negative tone associated with the sounding sequence; and
a DFT coefficient generation block to generate first DFT coefficients that are based on a nominal frequency of the positive tone and one or more frequency offset estimates between a transmitter frequency and a receiver frequency and to supply the first DFT coefficients to the first DFT block and to generate second DFT coefficients that are based on a nominal frequency of the negative tone and the one or more frequency offset estimates and to supply the second DFT coefficients to the second DFT block.

20. The apparatus as recited in claim 19,
wherein the first DFT block includes,
a first complex multiplier coupled to receive imaginary components of the sounding sequence and real components of the sounding sequence and to receive the first DFT coefficients; and
a first accumulator to receive real outputs of the first complex multiplier and to supply first accumulated real values;
a second accumulator to receive imaginary outputs of the first complex multiplier and to supply first accumulated imaginary values; and
wherein the second DFT block includes, a second complex multiplier coupled to receive the imaginary components of the sounding sequence and the real component of the sounding sequence and to receive the second DFT coefficients;

a third accumulator coupled to real outputs of the second complex multiplier and to supply second accumulated real values;

a fourth accumulator to receive imaginary outputs of the second complex multiplier and to supply second accumulated imaginary values;

an arctan function coupled to receive an average of the first accumulated real values and an average of the first accumulated imaginary values and an average of the second accumulated real values and an average of the second accumulated imaginary values and supply a first phase value and a second phase value used for fractional timing calculations.

* * * * *